(12) United States Patent
Newman et al.

(10) Patent No.: US 10,170,651 B2
(45) Date of Patent: Jan. 1, 2019

(54) METAL-DOPED CU(IN,GA) (S,SE)2 NANOPARTICLES

(71) Applicant: Nanoco Technologies, Ltd., Manchester (GB)

(72) Inventors: Christopher Newman, Holmfirth (GB); Ombretta Masala, Manchester (GB); Chet Steinhagen, St. Paul, MN (US)

(73) Assignee: Nanoco Technologies Ltd., Manchester (GB)

( * ) Notice: Subject to any disclaimer, the term of this patent is extended or adjusted under 35 U.S.C. 154(b) by 436 days.

(21) Appl. No.: 14/607,882

(22) Filed: Jan. 28, 2015

(65) Prior Publication Data

US 2015/0214400 A1     Jul. 30, 2015

Related U.S. Application Data

(60) Provisional application No. 61/933,616, filed on Jan. 30, 2014.

(51) Int. Cl.

| | |
|---|---|
| *B82Y 30/00* | (2011.01) |
| *B82Y 40/00* | (2011.01) |
| *H01L 31/032* | (2006.01) |
| *H01L 21/02* | (2006.01) |

(52) U.S. Cl.
CPC .... *H01L 31/0322* (2013.01); *H01L 21/02568* (2013.01); *H01L 21/02579* (2013.01); *H01L 21/02601* (2013.01); *H01L 21/02628* (2013.01); *H01L 31/0323* (2013.01); *Y02E 10/541* (2013.01)

(58) Field of Classification Search
CPC .......... B82Y 30/00; B82Y 40/00; H01L 31/02
See application file for complete search history.

(56) References Cited

U.S. PATENT DOCUMENTS

| 8,231,848 | B1 * | 7/2012 | Ren | B82Y 30/00 136/264 |
|---|---|---|---|---|
| 2008/0257201 | A1 | 10/2008 | Harris et al. | |
| 2009/0139574 | A1 | 6/2009 | Pickett et al. | |
| 2009/0260670 | A1 | 10/2009 | Li | |
| 2009/0320916 | A1 | 12/2009 | Yuan et al. | |
| 2012/0282730 | A1 | 11/2012 | Liao et al. | |
| 2013/0233202 | A1 | 9/2013 | Cao et al. | |

FOREIGN PATENT DOCUMENTS

| EP | 2647595 A2 | 10/2013 | |
|---|---|---|---|
| WO | WO 2011028011 A2 * | 3/2011 | ........... C01B 19/002 |
| WO | 2012075267 A1 | 6/2012 | |

OTHER PUBLICATIONS

Nakamura H et al: "Tunable photoluminescence wavelength of chalcopyrite CuinS2-based semiconductor nanocrystals synthesized in a colloidal system", Chemistry of Materials, American Chemical Society, US, vol. 18, No. 14, Jan. 1, 2006 (Jan. 1, 2006), pp. 3330-3335, XP002534014, ISSN: 0897-4756, DOI: 10.1021/CM0518022 p. 3331, right-hand column, paragraph 4-6 p. 3334, right-hand column, paragraph 2.

Jung Eun Lee et al: "Characterization of Na-doped CuinS2 thin film absorber layer formed by a non-vacuum ink process", Proceedings of the 37th IEEE Photovoltaic Specialists Conference (PVSC), Jun. 19, 2011 (Jun. 19, 2011), pp. 1292-1293, XP032167938, DOI: 10.1109 PVSC.2011.6186194 ISBN: 978-1-4244-9966-3 cited in the application p. 1292, right-hand column.

Lee Dongwook et al: "Non-vacuum deposition of CIGS absorber films for low-cost thin film solar cells", Korean Journal of Chemical Engineering, vol. 30. No. 7, Jun. 22, 2013 (Jun. 22, 2013), pp. 1347-1358, XP035305637. ISSN: 0256-1115, DOI: 10.1007/S11814-013-0101-0 [retrieved on Jun. 22, 2013] p. 1349-p. 1351, left-hand column.

Guo, Q. et al., "Sulfide Nanocrystal Inks for Dense $Cu(In_{1-x}Ga_x)(S_{1-y}Se_y)_2$ Absorber Films and Their Photoboltaic Performance", Nano Letters, (2009), vol. 9, No. 8, pp. 3060-3065.

Kimura, T. et al., "Effects of Sodium on $CuIn_3Se_5$ Thin Films", Jpn., J. Appl. Phys., (1999), vol. 38, L899-L901.

Yuan, M. et al., "Antimony assisted low-temperature processing of $CuIn_{1-x}Ga_xSe_{2-y}S_y$ solar cells", Thin Solid Films, (2010), 519, 852-856.

Guo, Q. et al., Ink formulation and low-temperature incorporation of sodium to yield 12% efficient $Cu(In,Ga)(S,Se)_2$ solar cells from sulfide nanocrystal inks, Prog. Photovolt. Res. Appl., (2013), 21, 64-71.

Hergert, F. et al., "Formation reactions of chalcopyrite compounds and the role of sodium doping", Thin Solid Films, (2007), 515, 5843.

Zhou, H. et al., "Rational Defect Passivation of $Cu_2ZnSn(S,Se)_4$ Photovoltaics with Solution-Processed $Cu_2ZnSnS_4$: Na Nanocrystals", J. Am. Chem. Soc., (2013), 135, 15998.

Yuan, Min et al., "Optimization of CIGS-Based PV Device through Antimony Doping", Chem. Mater., (2010), American Chemical Society, pubs.acs.org/cm.

Carrate, A. et al., "Antimony-Based Ligand Exchange to Promote Crystallization in Spray-Deposited $Cu_2ZnSnSe_4$ Solar Cells", J. Am Chem. Soc., (2013), pubs.acs.org/JACS.

Gupta, R. J. et al., "Growth, Synthesis and Characterization of Large Grain $CuInSe_2$ in Bulk and Thin Film Form", Journal of Crystal Growth, (1988), vol. 87, 151.

* cited by examiner

*Primary Examiner* — Haidung D Nguyen
(74) *Attorney, Agent, or Firm* — Blank Rome LLP

(57) ABSTRACT

Various methods are used to provide a desired doping metal concentration in a CIGS-containing ink when the CIGS layer is deposited on a photovoltaic device. When the doping metal is sodium, it may be incorporated by: adding a sodium salt, for example sodium acetate, together with the copper-, indium- and/or gallium-containing reagents at the beginning of the synthesis reaction of $Cu(In,Ga)(S,Se)_2$ nanoparticles; synthesizing $Cu(In,Ga)(S,Se)_2$ nanoparticles and adding a sodium salt to the reaction solution followed by mild heating before isolating the nanoparticles to aid sodium diffusion; and/or, using a ligand that is capable of capping the Cu(In, Ga)(S,Se)$_2$ nanoparticles with one end of its molecular chain and binding to sodium atoms with the other end of its chain.

5 Claims, 3 Drawing Sheets

METAL-DOPED CU(IN,GA) (S,SE)2 NANOPARTICLES

CROSS-REFERENCE TO RELATED APPLICATIONS

This application claims the benefit of U.S. Provisional Application No. 61/933,616 filed on Jan. 30, 2014.

BACKGROUND OF THE INVENTION

1. Field of the Invention

The present invention generally relates to photovoltaic devices. More particularly, it relates to copper indium gallium diselenide/disulfide-based, thin film, photovoltaic devices.

2. Description of the Related Art including Information Disclosed under 37 CFR 1.97 and 1.98

Semiconductor materials like copper indium gallium diselenides and sulfides ($Cu(In,Ga)(S,Se)_2$, herein referred to as "GIGS") are strong light absorbers and have band gaps that match well with the optimal spectral range for photovoltaic (PV) applications. Furthermore, because these materials have strong absorption coefficients, the active layer in the solar cell is required to be only a few microns thick.

Copper indium diselenide ($CuInSe_2$) is one of the most promising candidates for thin film PV applications due to its unique structural and electrical properties. Its band gap of 1.0 eV is well-matched with the solar spectrum. $CuInSe_2$ solar cells can be made by selenization of $CuInS_2$ films because, during the selenization process, Se replaces S and the substitution creates volume expansion, which reduces void space and reproducibly leads to a high quality, dense $CuInSe_2$ absorber layers. [Q. Guo, G. M. Ford, H. W. Hillhouse and R. Agrawal, Nano Lett., 2009, 9, 3060] Assuming complete replacement of S with Se, the resulting lattice volume expansion is ~14.6%, which is calculated based on the lattice parameters of chalcopyrite (tetragonal) $CuInS_2$ (a=5.52 Å, c=11.12 Å) and $CuInSe_2$ (a=5.78 Å, c=11.62 Å). This means that the $CuInS_2$ nanocrystal film can be easily converted to a predominantly selenide material, by annealing the film in a selenium-rich atmosphere. Therefore, $CuInS_2$ is a promising alternative precursor for producing $CuInSe_2$ or $CuIn(S,Se)_2$ absorber layers.

The theoretical optimum band gap for absorber materials is in the region of 1.2-1.4 eV. By incorporating gallium into $CuIn(S,Se)_2$ thin films, the band gap can be manipulated such that, following selenization, a $Cu_xIn_yGa_zS_aSe_b$ absorber layer is formed with an optimal band gap for solar absorption.

Conventionally, costly vapor phase or evaporation techniques (for example metalorganic chemical vapor deposition (MO-CVD), radio frequency (RF) sputtering, and flash evaporation) have been used to deposit the CIGS films on a substrate. While these techniques deliver high quality films, they are difficult and expensive to scale to larger-area deposition and higher process throughput. Thus, solution processing of CIGS materials has been explored. One such approach involves depositing CIGS nanoparticles, which can be thermally processed to form a crystalline CIGS layer.

One of the major advantages of using nanoparticles of CIGS is that they can be dispersed in a medium to form an ink that can be printed on a substrate in a similar way to inks in a newspaper-like process. The nanoparticle ink or paste can be deposited using low-cost printing techniques such as spin coating, slit coating and doctor blading. Printable solar cells could replace the standard conventional vacuum-deposited methods of solar cell manufacture because the printing processes, especially when implemented in a roll-to-roll processing framework, enables a much higher throughput.

The synthetic methods developed so far offer limited control over the particle morphology, and particle solubility is usually poor which makes ink formulation difficult.

The challenge is to produce nanoparticles that overall are small, have low melting point, narrow size distribution and incorporate a volatile capping agent, so that they can be dispersed in a medium and the capping agent can be eliminated easily during the film baking process. Another challenge is to avoid the inclusion of impurities, either from synthetic precursors or organic ligands that could compromise the overall efficiency of the final device.

U.S. Publication No. 2009/0139574 [Preparation of Nanoparticle Material, published 4 Jun., 2009], the entire contents of which are incorporated herein by reference, describes the synthesis of colloidal CIGS nanoparticles with a monodisperse size distribution, capped with organic ligands that enable solution processing and can be removed at relatively low temperatures during thermal processing.

One of the challenges associated with the nanoparticle-based CIGS deposition approach is to achieve large grains after thermal processing. Grain sizes on the order of the film thickness are desirable since grain boundaries act as electron-hole recombination centres. Elemental dopants, such as sodium [R. Kimura, T. Mouri, N. Takuhai, T. Nakada, S. Niki, A. Yamada, P. Fons, T. Matsuzawa, K. Takahashi and A. Kunioka, Jpn. J. Appl. Phys., 1999, 38, L899] and antimony, [M. Yuan, D. B. Mitzi, W. Liu, A. J. Kellock, S. J. Chey and V. R. Deline, Chem. Mater., 2010, 22, 285] have been reported to enhance the grain size of CIGS films and thus the power conversion efficiency (PCE) of the resulting devices.

The incorporation of sodium into CIGS is a well-known method for increasing maximum photovoltaic cell efficiencies. The effect of sodium is thought to be an increase in the net carrier concentration and film conductivity, and possibly enhancement of grain growth. Sodium is typically added in concentrations ranging between 0.1-1.0% by weight.

A common method used to incorporate sodium is by diffusion from soda-lime glass (SLG) substrates through a molybdenum back contact layer into an adjacent CIGS layer. The processes limiting or enabling sodium diffusion from the SLG during crystal growth are currently not well understood. One drawback of this method is that the diffusion of sodium is not easily controlled.

Other known incorporation methods include diffusion from a thin sodium-containing precursor layer that is deposited either below or above the CIGS absorber layer, co-evaporation of a sodium compound during the growth of CIGS or soaking the CIGS films into a sodium salt solution. For example, Guo et al. incorporated sodium into films prepared from CIGS nanoparticles by soaking the films in 1 M aqueous sodium chloride solution, prior to selenization. [Q. Guo, G. M. Ford, R. Agrawal and H. Hillhouse, Prog. Photovolt. Res. Appl., 2013, 21, 64]

These methods require either sodium-free substrates or alkali-diffusion barriers (such as $Al_2O_3$ or very dense molybdenum). Otherwise, too much sodium may be incorporated into the CIGS if SLG substrates are used.

Examples of sodium compounds typically used in the methods mentioned above include sodium fluoride (NaF), sodium selenide ($Na_2Se$), and sodium sulfide ($Na_2S$).

These incorporation methods involve a multi-step process where the sodium-containing compound is produced at a separate stage, before or after the growth absorber layer. This is achieved by using expensive vacuum deposition techniques and cannot be applied to printable photovoltaic devices produced by printing a CIGS ink on flexible substrates on a roll-to-roll process.

Soaking in a sodium salt solution is a simple method but it is not clear how well the incorporation of sodium may be tuned using this process.

In the prior art, where CIGS films have been prepared by the sputtering of Cu—In—Ga precursors followed by selenization, sodium doping may result in phase segregation of $CuInSe_2$ and $CuGaSe_2$, despite promoting grain growth within the $CuInSe_2$ layer. [F. Hergert, S. Jost, R. Hock, M. Purwins and J. Palm, *Thin Solid Films*, 2007, 515, 5843] Thus, a nanoparticle-based approach, where the quaternary CIGS phase is inherent within the nanoparticles, may enable sodium-enhanced grain growth without phase segregation.

A method to dope $Cu_2ZnSnS_4$ (CZTS) nanoparticles with sodium has previously been described by Zhou et al. [H. Zhou, T.-B. Song, W.-C. Hsu, S. Luo, S. Ye, H.-S. Duan, C. J. Hsu, W. Yang and Y. Yang, *J. Am. Chem. Soc.*, 2013, 135, 15998] The sodium-doped CZTS nanoparticles were prepared by a "hot-injection" method, whereby a sulfur precursor was injected into a solution of copper, zinc and tin precursor salts dissolved in oleylamine at elevated temperature. Following a period of annealing, a solution of sodium trifluoroacetate ($CF_3COONa$) in oleic acid was injected into the CZTS nanoparticle solution, then annealed for a further time period. The ratio of $Na/(Cu+Zn+Sn)$ was tunable from 0.5-10%, and characterization suggested that the sodium was distributed on the nanoparticle surface, rather than homogeneously throughout the nanoparticles. To date, adaptation of the method for the preparation of sodium-doped CIGS nanoparticles has not been reported.

Mitzi and co-workers have explored the incorporation of antimony into CIGS devices formed using a hydrazine solution-based deposition approach. Significant grain growth was observed using $Sb_2S_3/S$ in hydrazine, with an improvement in PCE from 10.3% for undoped films to 12.3% for films doped with 0.2 mol. % Sb. [M. Yuan, D. B. Mitzi, W. Liu, A. J. Kellock, S. J. Chey and V. R. Deline, *Chem. Mater.*, 2010, 22, 285] At 1.2 mol. %, grain growth could be observed for films annealed at low temperatures (<400° C.). [M. Yuan, D. B. Mitzi, O. Gunawan, A. J. Kellock, S. J. Chey and V. R. Deline, *Thin Solid Films*, 2010, 519, 852] Despite the improvements in grain size and PCE with antimony doping, the deposition approach carries significant risk owing to the toxic and unstable nature of hydrazine. In addition, the precautions required to safely handle hydrazine pose a significant challenge when scaling the method.

Carrate et al. described ligand exchange process to displace organic ligands on the surface of CZTS nanoparticles, substituting them with an antimony salt ($SbCl_3$), via a biphase system. [A. Carrate, A. Shavel, X. Fontané, J. Montserrat, J. Fan, M. Ibáñez, E. Saucedo, A. Pérez-Rodriguez and A. Cabot, *J. Am. Chem. Soc.*, 2013, 135, 15982] The $CZTS-SbCl_3$ nanoparticles were stable in solution for sufficient time to allow spray deposition.

Though the nanoparticles fabricated by Carrate et al. could be deposited by spray-coating, the lack of organic ligands on the nanoparticle surface may render the material difficult to process using other coating techniques, for which organic components of the ink formulation are critical to its coating properties.

The preparation of antimony-coated CIGS nanoparticles has not yet been reported in the prior art.

Grain growth in $CuInSe_2$ thin films has also been reported upon doping of the $CuInSe_2$ flux with 2 wt. % cadmium or bismuth, followed by localised, pulsed annealing using an electron beam. [R. J. Gupta, D. Bhattacharya and O. N. Sullivan, *J. Cryst. Growth*, 1988, 87, 151] Grain sizes of up to 10 μm were observed by transition electron microscopy (TEM). However, pulsed annealing may not be an easy process to scale. Additionally, doping with toxic cadmium may be unfavourable.

Thus, a method to form doped CIGS films using a nanoparticle-based deposition approach would be beneficial.

BRIEF SUMMARY

The method described herein incorporates metal dopants directly during the growth of the CIGS nanoparticles without the need of a multi-step process or expensive vacuum techniques.

The metal-doped nanoparticles may be dispersed into a solvent to form an ink that is printed and sintered to form thin films by melting or fusing the nanoparticle precursor material such that the nanoparticles coalesce to form large-grained, thin films. FIG. 1 is a flow diagram summarizing a preparative procedure for forming a CIGS film from CIGS nanoparticles and subsequently fabricating a PV device.

The method provides a desired doping metal concentration in a CIGS-containing ink when the CIGS layer is deposited on a photovoltaic device.

When the doping metal is sodium, it may be incorporated by:

adding a sodium salt, for example sodium acetate, together with the copper-, indium- and/or gallium-containing reagents at the beginning of the synthesis reaction of $Cu(In,Ga)(S,Se)_2$ nanoparticles;

synthesizing $Cu(In,Ga)(S,Se)_2$ nanoparticles and adding a sodium salt to the reaction solution followed by mild heating before isolating the nanoparticles to aid sodium diffusion; and/or, using a ligand that is capable of capping the $Cu(In,Ga)(S,Se)_2$ nanoparticles with one end of its molecular chain and binding to sodium atoms with the other end of its chain.

When the doping metal is antimony, it may be incorporated by:

adding an antimony salt, for example antimony acetate, together with the copper-, indium- and/or gallium-containing reagents at the beginning of the synthesis reaction of $Cu(In,Ga)(S,Se)_2$ nanoparticles;

synthesizing $Cu(In,Ga)(S,Se)_2$ nanoparticles and adding an antimony salt to the reaction solution followed by mild heating before isolating the nanoparticles to aid antimony diffusion; and/or, using a ligand that is capable of capping the $Cu(In,Ga)(S,Se)_2$ nanoparticles with one end of its molecular chain and binding to antimony atoms with the other end of its chain.

BRIEF DESCRIPTION OF THE SEVERAL VIEWS OF THE DRAWING(S)

DETAILED DESCRIPTION

The present disclosure involves a method to controllably incorporate metals, such as sodium and/or antimony, into CIGS nanoparticles. The metal-doped CIGS nanoparticles may be deposited with different printing methods to form films of suitable thickness.

The following are different methods that incorporate sodium (by way of example) into CIGS nanoparticles:

In a first embodiment, a sodium salt, for example sodium acetate, is added together with the copper-, indium- and/or gallium-containing reagents at the beginning of the synthesis reaction of $Cu(In,Ga)(S,Se)_2$ nanoparticles (e.g., that disclosed in U.S. Pub. No. 2009/0139574). Suitable sodium salts other than sodium acetate include, but are not limited to, inorganic salts such as sodium chloride, sodium fluoride, sodium bromide and other organic salts such as sodium oleate and sodium alkyldithiocarbamate salts such as sodium diethyldithiocarbamate, sodium dimethyldithiocarbamate, sodium methylhexyldithiocarbamate and sodium ethylhexyldithiocarbamate.

Figure 1:
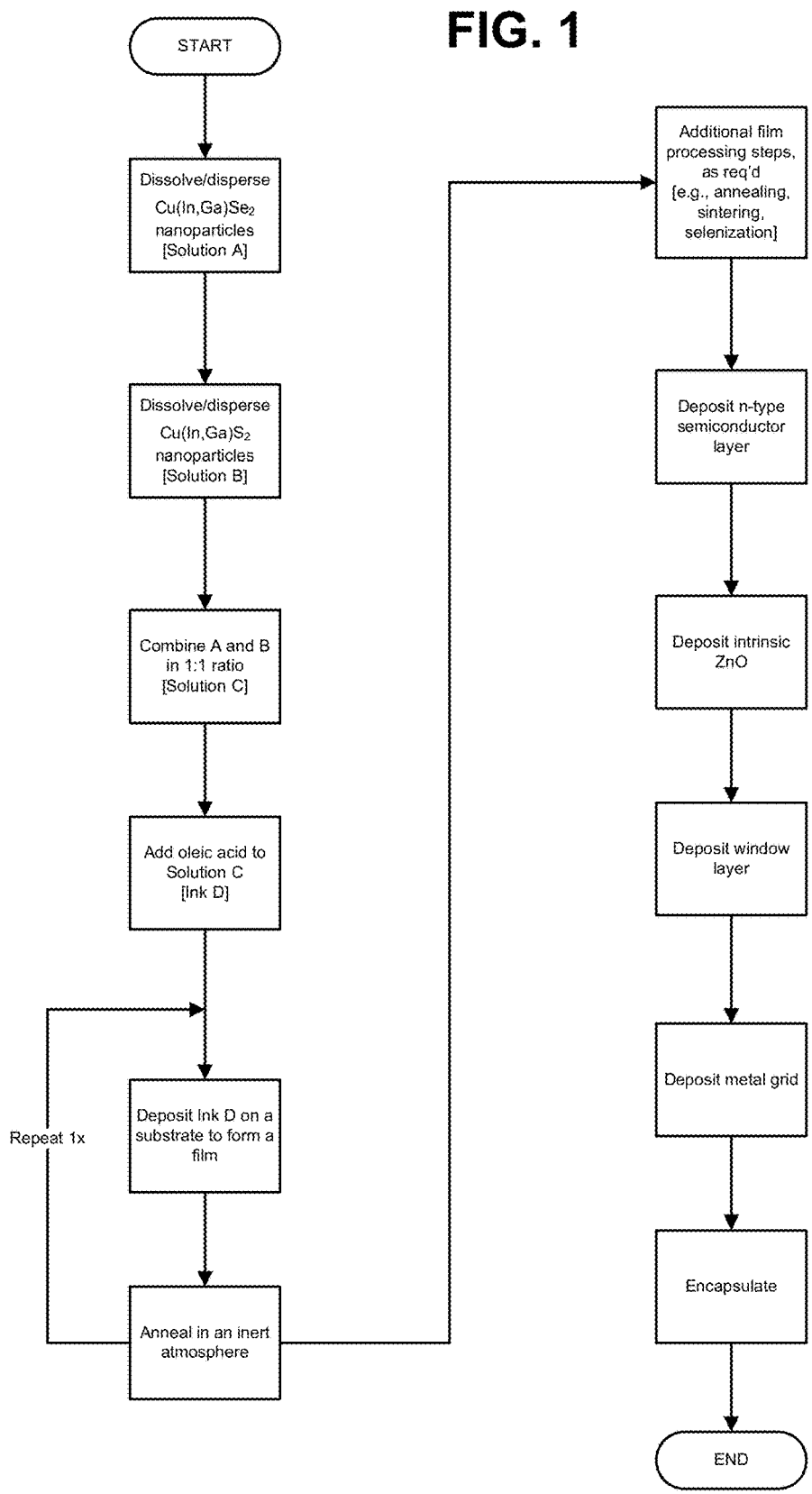
FIG. 1 is a flowchart depicting a method for formulating a CIGS nanoparticle-based ink that can be processed to form a thin film and then fabricate a photovoltaic device incorporating such a film.
Figure 2:
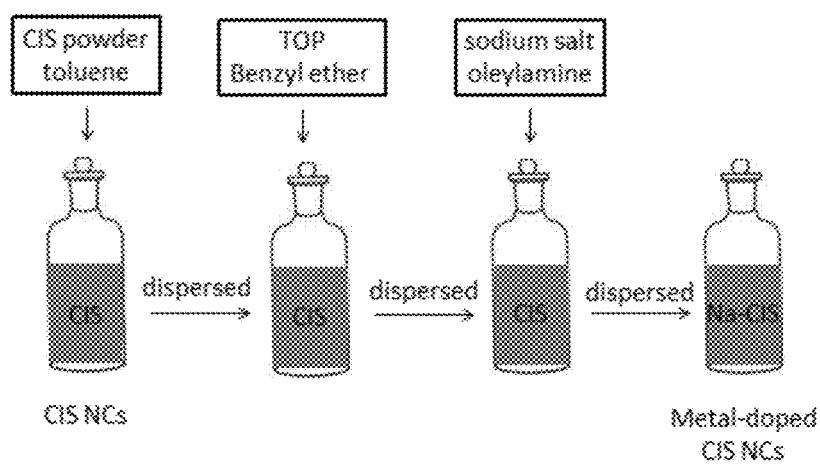
FIG. 2 is a schematic depiction of a process for incorporating metals into CIGS nanoparticles.

In a second embodiment, the $Cu(In,Ga)(S,Se)_2$ nanoparticles are synthesized and a sodium salt is subsequently added to the reaction solution, followed by mild heating, before isolating the nanoparticles to aid sodium diffusion. This method permits the incorporation of sodium without the need for having sodium salts present throughout the synthesis of the CIGS nanoparticles. This method is particularly useful when the sodium salt may interfere at some stage during the synthesis. This method may also be performed as a separate step after the isolation of the nanoparticles, as illustrated in FIG. 2 wherein "TOP" is trioctylphosphine and "NC" is nanocrystal. In some embodiments, the sodium salt is incorporated at room temperature. In alternative embodiments, the sodium salt is added to a dispersion of the CIGS nanoparticles, followed by heating, for example at 200° C.

Figure 3:
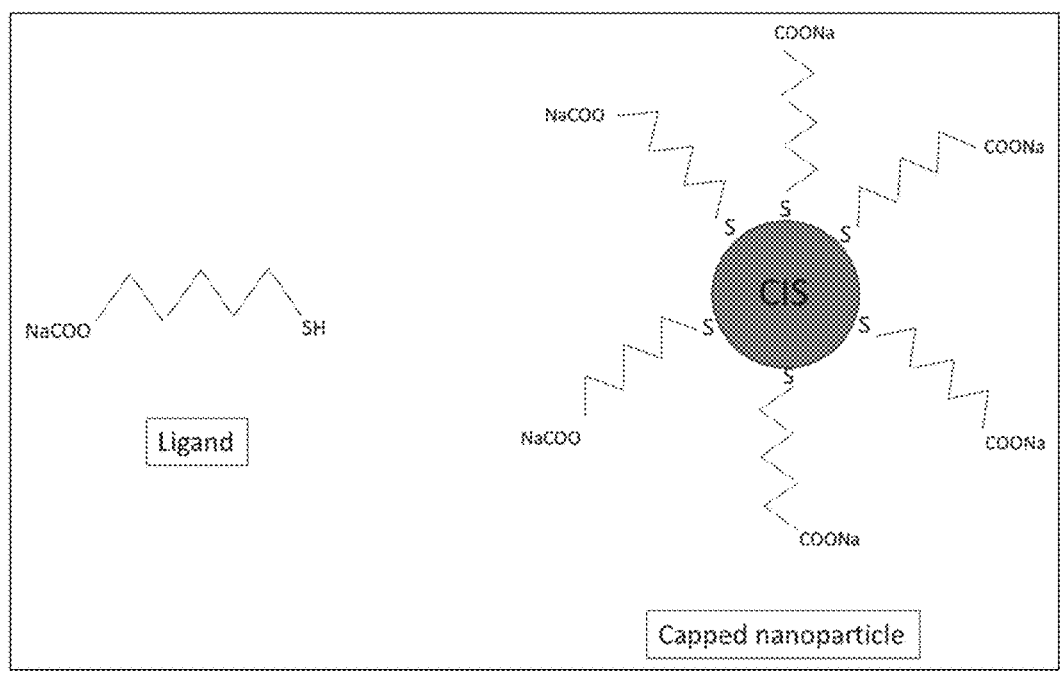
FIG. 3 is a schematic depiction of a ligand-capped nanoparticle according to the invention.

In a third embodiment, a sodium-containing ligand is used that is capable of capping the $Cu(In,Ga)(S,Se)_2$ nanoparticles with one end of its molecular chain and binding to sodium atoms with the other end of the chain. An example of this type of ligand is a thiol ligand with a carboxylate group at the other end capable of binding sodium as illustrated in FIG. 3.

This method may be extended to the doping of CIGS nanoparticles with other metals, for example antimony (Sb). Suitable antimony salts include, but are not restricted to, antimony acetate, triphenylantimony and tris(dimethylamino)antimony, antimony halides such as antimony chloride, antimony fluoride, antimony bromide and antimony iodide, and antimony dialkyldithiocarbamates such as antimony diethyldithiocarbamate, antimony dimethyldithiocarbamate, antimony methylhexyldithiocarbamate and antimony ethylhexyldithiocarbamate.

The method allows the incorporation of a metal directly in the nanoparticle precursor without the use of vacuum techniques.

The methods described above allow the incorporation of a metal while the nanoparticle precursor is being synthesized thereby removing the need for an additional step to include the metal. Because the synthetic method enables control of the amount of metal introduced, levels of incorporated metal may be accurately tuned. The metal distribution is likely preserved during the sintering process to produce metal-doped CIGS films.

A process for producing nanoparticles incorporating ions selected from groups 13 [Al, Ga, In], 16 [S, Se, Te], and 11 [Ce, Ag, Au] or 12 [Zn, Cd] of the periodic table is disclosed in U.S. Publication No. 2009/0139574 by Nigel Pickett and James Harris the disclosure of which is hereby incorporated by reference in its entirety. In one embodiment, the disclosed process includes effecting conversion of a nanoparticle precursor composition comprising group 13, 16, and 11 or 12 ions to the material of the nanoparticles in the presence of a selenol compound. Other embodiments include a process for fabricating a thin film including nanoparticles incorporating ions selected from groups 13, 16, and 11 or 12 of the periodic table as well as a process for producing a printable ink formulation including the nanoparticles.

Although particular embodiments have been shown and described, they are not intended to limit what this patent covers. One skilled in the art will understand that various changes and modifications may be made.

Various embodiments are illustrated by the following examples.

Example 1: Preparation of Sodium-Doped $CuInS_2$ Nanoparticles Using Sodium Diethyldithiocarbamate An oven-dried 250 mL round-bottom flask was charged with copper(I) acetate (2.928 g, 23.88 mmol), indium(III) acetate (9.706 g, 33.25 mmol) and benzyl ether (50 mL). The flask was fitted with a Liebig condenser and collector, and the mixture was degassed at 100° C. for 1 hour. The flask was then back-filled with nitrogen. Degassed 1-octanethiol (40 mL, 230 mmol) was added to the mixture, which was subsequently heated to 200° C. for 2 hours. A suspension of sodium diethyldithiocarbamate trihydrate (1.390 g, 6.169 mmol) in benzyl ether (18 mL)/oleylamine (2 mL) was added and the residue was rinsed with a small amount of methanol. The temperature was maintained at 200° C. for a further 30 minutes, before being allowed to cool to 160° C. and stirring for ~18 hours. The mixture was then cooled to room temperature.

The nanoparticles were isolated in aerobic conditions, via centrifugation, using isopropanol, toluene, methanol and dichloromethane, then dried under vacuum.

Characterization by inductively coupled plasma organic emission spectroscopy (ICP-OES) gave the following elemental composition by mass: 13.04% Cu; 30.70% In; 0.628% Na; 20.48% S. This equates to a stoichiometry of $CuIn_{1.30}Na_{0.13}S_{3.11}$, i.e. 13% sodium compared to the number of moles of copper. The organo-thiol ligand contributes to the total sulfur content.

Example 2: Preparation of Sodium-Doped $CuInS_2$ Nanoparticles Using Sodium Oleate An oven-dried 250 mL round-bottom flask was charged with copper(I) acetate (2.929 g, 23.89 mmol), indium(III) acetate (9.707 g, 33.25 mmol) and benzyl ether (50 mL). The flask was fitted with a Liebig condenser and collector, and the mixture was degassed at 100° C. for 1 hour. The flask was then back-filled with nitrogen. Degassed 1-octanethiol (40 mL, 230 mmol) was added to the mixture, which was subsequently heated to 200° C. for 2 hours. A suspension of sodium oleate (1.879 g, 6.172 mmol) in benzyl ether (20 mL) was added and the residue was rinsed with a small amount of methanol. The temperature was maintained at 200° C. for a further 30 minutes, before being allowed to cool to 160° C. and stirring for ~18 hours. The mixture was then cooled to room temperature.

The nanoparticles were isolated in aerobic conditions, via centrifugation, using isopropanol, toluene, methanol and dichloromethane, then dried under vacuum.

Characterization by inductively coupled plasma organic emission spectroscopy (ICP-OES) gave the following elemental composition by mass: 13.04% Cu; 28.31% In; 0.784% Na; 19.86% S. This equates to a stoichiometry of $CuIn_{1.20}Na_{0.17}S_{3.02}$, i.e. 17% sodium compared to the number of moles of copper. The organo-thiol ligand contributes to the total sulfur content.

Example 3: Preparation of Sodium-Doped $CuInS_2$ Nanoparticles Using Sodium Oleate An oven-dried 250 mL round-bottom flask was charged with copper(I) acetate (2.928 g, 23.88 mmol), indium(III) acetate (9.705 g, 33.24 mmol), sodium oleate (0.743 g, 2.44 mmol) and benzyl ether (50 mL). The flask was fitted with a Liebig condenser and collector, and the mixture was degassed at 100° C. for 1 hour. The flask was then back-filled with nitrogen. Degassed 1-octanethiol (40 mL, 230 mmol) was added to the mixture, which was subsequently heated to 200° C. for 2 hours, before being allowed to cool to 160° C. and annealing for ~18 hours. The mixture was then cooled to room temperature.

The nanoparticles were isolated in aerobic conditions, via centrifugation, using isopropanol, toluene, methanol, dichloromethane and acetone, then dried under vacuum.

Characterization by inductively coupled plasma organic emission spectroscopy (ICP-OES) gave the following elemental composition by mass: 13.43% Cu; 28.56% In; 0.96% Na; 20.19% S. This equates to a stoichiometry of $CuIn_{1.18}Na_{0.20}S_{2.98}$, i.e. 20% sodium compared to the number of moles of copper. The organo-thiol ligand contributes to the total sulfur content.

Example 4: Preparation of Antimony-Doped $Cu(In,Ga)S_2$ Nanoparticles Using Triphenylantimony A 100 mL round-bottom flask was charged with copper(I) acetate (0.369 g, 3.01 mmol), indium(III) acetate (0.7711 g, 2.641 mmol), gallium(III) acetylacetonate (0.4356 g, 1.187 mmol), triphenylantimony (0.055 g, 160 µmol), benzyl ether (6 mL) and a 1 M solution of sulfur in oleylamine (9 mL, 9 mmol). The mixture was degassed at 100° C. for 1 hour, then the flask was back-filled with nitrogen. 1-Octanethiol (4.8 mL, 28 mmol) was injected into the flask, which was subsequently heated to 200° C. and held for 2 hours. The temperature was decreased to 160° C. and held overnight. The mixture was then cooled to room temperature.

The nanoparticles were isolated in aerobic conditions, via centrifugation, using toluene and methanol.

Characterization by inductively coupled plasma organic emission spectroscopy (ICP-OES) gave the following elemental composition by mass: 15.47% Cu; 26.09% In; 6.41% Ga; 0.25% Sb; 20.67% S. This equates to a stoichiometry of $CuIn_{0.93}Ga_{0.38}Sb_{0.01}S_{2.65}$, i.e. 1% antimony compared to the number of moles of copper. The organo-thiol ligand contributes to the total sulfur content.

Example 5: Preparation of Antimony-Doped $Cu(In,Ga)S_2$ Nanoparticles Using Antimony Acetate A 100 mL round-bottom flask was charged with copper(I) acetate (0.369 g, 3.01 mmol), indium(III) acetate (0.7711 g, 2.641 mmol), gallium(III) acetylacetonate (0.4356 g, 1.187 mmol), antimony(III) acetate (0.047 g, 160 µmol), benzyl ether (6 mL) and a 1 M solution of sulfur in oleylamine (9 mL, 9 mmol). The mixture was degassed at 100° C. for 1 hour, then the flask was back-filled with nitrogen. 1-Octanethiol (4.8 mL, 28 mmol) was injected into the flask, which was subsequently heated to 200° C. and held for 2 hours. The temperature was decreased to 160° C. and held overnight. The mixture was then cooled to room temperature.

The nanoparticles were isolated in aerobic conditions, via centrifugation, using toluene and methanol.

Characterization by inductively coupled plasma organic emission spectroscopy (ICP-OES) gave the following elemental composition by mass: 15.39% Cu; 26.02% In; 6.17% Ga; 0.92% Sb; 21.20% S. This equates to a stoichiometry of $CuIn_{0.94}Ga_{0.37}Sb_{0.03}S_{2.73}$, i.e. 3% antimony compared to the number of moles of copper. The organo-thiol ligand contributes to the total sulfur content.

Although particular embodiments of the present invention have been shown and described, they are not intended to limit what this patent covers. One skilled in the art will understand that various changes and modifications may be made without departing from the scope of the present invention as literally and equivalently covered by the following claims.

We claim:

1. A process for preparing sodium-doped nanocrystals comprising:
   adding a sodium dialkyldithiocarbamate to a mixture of copper-, indium-, and gallium-containing reagents at the beginning of a synthesis reaction to form sodium-doped $Cu(In,Ga)(S,Se)_2$ nanoparticles.

2. The process of claim 1 wherein the sodium dialkyldithiocarbamate is sodium diethyldithiocarbamate.

3. The process of claim 1 wherein the sodium dialkyldithiocarbamate is sodium dimethyldithiocarbamate.

4. The process of claim 1 wherein the sodium dialkyldithiocarbamate is sodium methylhexyldithiocarbamate.

5. The process of claim 1 wherein the sodium dialkyldithiocarbamate is sodium ethylhexyldithiocarbamate.

* * * * *